United States Patent
Grushka et al.

(10) Patent No.: US 11,916,807 B2
(45) Date of Patent: Feb. 27, 2024

(54) EVALUATION FRAMEWORK FOR CLOUD RESOURCE OPTIMIZATION

(71) Applicant: MICROSOFT TECHNOLOGY LICENSING, LLC, Redmond, WA (US)

(72) Inventors: Hagit Grushka, Beer-Sheva (IL); Rachel Lemberg, Herzliya (IL); Jeremy Samama, Herzliya (IL); Eliya Habba, Petah Tikva (IL); Mohammad Salama, Herzliya (IL)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 1 day.

(21) Appl. No.: 17/733,031

(22) Filed: Apr. 29, 2022

(65) Prior Publication Data
US 2023/0246981 A1 Aug. 3, 2023

Related U.S. Application Data

(60) Provisional application No. 63/305,183, filed on Jan. 31, 2022.

(51) Int. Cl.
*H04L 47/762* (2022.01)
*H04L 47/78* (2022.01)
(Continued)

(52) U.S. Cl.
CPC ........... *H04L 47/762* (2013.01); *H04L 43/50* (2013.01); *H04L 47/781* (2013.01); *H04L 47/803* (2013.01); *H04L 47/822* (2013.01)

(58) Field of Classification Search
CPC ..... H04L 47/762; H04L 43/50; H04L 47/781; H04L 47/803; H04L 47/822
See application file for complete search history.

(56) References Cited

U.S. PATENT DOCUMENTS

| 2006/0235675 A1 | 10/2006 | Oslake et al. |
| 2019/0130326 A1* | 5/2019 | Carley ............... G06F 11/3457 |
| 2021/0117307 A1* | 4/2021 | MacNamara ......... G06F 11/302 |

(Continued)

FOREIGN PATENT DOCUMENTS

| CN | 110968495 A | 4/2020 |
| CN | 113157422 A | 7/2021 |
| CN | 113391913 A | 9/2021 |

OTHER PUBLICATIONS

"International Search Report and Written Opinion Issued in PCT Application No. PCT/US22/048340", dated Feb. 16, 2023, 11 Pages.

(Continued)

*Primary Examiner* — Glenton B Burgess
*Assistant Examiner* — Jihad K Boustany
(74) *Attorney, Agent, or Firm* — Newport IP, LLC; Jacob P. Rohwer

(57) ABSTRACT

The techniques disclosed herein enable a system to perform a robust evaluation of resource requirement recommendations through a simulated computing environment that closely resembles current conditions of a live computing environment. To achieve this, system characteristics such as CPU, RAM, and storage are extracted from currently available computing resources at the live computing environment. In addition, active software deployments at the live computing environment are randomly sampled to generate an activity dataset. The system characteristics and the activity dataset are then used to generate the simulated computing environment. Instances of a pending software deployment are then assigned to the simulated computing environment according to a resource requirement recommendation. The instances are then executed across various scenarios and analyzed to calculate a level of resource utilization. Consequently, several resource requirement recommendations can (Continued)

be evaluated and compared simultaneously thereby enabling the system to select the best resource requirement recommendation.

20 Claims, 11 Drawing Sheets

(51) Int. Cl.
*H04L 43/50* (2022.01)
*H04L 47/70* (2022.01)
*H04L 47/80* (2022.01)

(56) References Cited

U.S. PATENT DOCUMENTS

| | | | |
|---|---|---|---|
| 2021/0149737 A1 | 5/2021 | An et al. | |
| 2022/0197773 A1* | 6/2022 | Butler | G06F 9/5038 |
| 2022/0269576 A1* | 8/2022 | Shirodkar | G06Q 10/06375 |
| 2022/0303189 A1* | 9/2022 | Karri | H04L 43/045 |

OTHER PUBLICATIONS

Fu, et al., "Containerized Framework for Building Control Performance Comparisons: Model Predictive Control vs Deep Reinforcement Learning Control", In Proceedings of the 8th ACM International Conference on Systems for Energy-Efficient Buildings, Cities, and Transportation, Nov. 17, 2021, pp. 276-280.

Lukianykhin, et al., "ModelicaGym: Applying Reinforcement Learning to Modelica Models", In Proceedings of the International Workshop on Equation-based Object-oriented Modeling Languages and Tools, Nov. 5, 2019, 10 Pages.

Murad, et al., "IoT Sensor Gym: Training Autonomous IoT Devices with Deep Reinforcement Learning", In Proceedings of the 9th International Conference on the Internet of Things, Oct. 22, 2019, 4 Pages.

Sang, et al., "RALaaS: Resource-Aware Learning-as-a-Service in Edge-Cloud Collaborative Smart Connected Communities", In Proceedings of the Globecom IEEE Global Communications Conference, Dec. 7, 2020, 6 Pages.

* cited by examiner

EVALUATION FRAMEWORK FOR CLOUD RESOURCE OPTIMIZATION

PRIORITY APPLICATION

The present application is a non-provisional application of, and claims priority to, U.S. Provisional Application Ser. No. 63/305,183 filed on Jan. 31, 2022, the contents of which are hereby incorporated by reference in their entirety.

BACKGROUND

As cloud computing gains popularity, more and more data and/or services are stored and/or provided online via network connections. Providing an optimal and reliable user experience is an important aspect for cloud-based platforms that offer network services. In many scenarios, a cloud-based platform may provide a service to thousands or millions of users (e.g., customers, clients, tenants) geographically dispersed around a country, or even the world. In order to provide this service, a cloud-based platform often includes different resources, such as server farms containing clusters and nodes, hosted in various datacenters. In addition, the cloud-based platform can be constructed using various software components which can enable users to build and host their own platforms and services.

To effectively manage a cloud service, especially at a large scale, many providers utilize orchestration systems such as Kubernetes to handle the deployment and scaling of software. Such systems maintain stability and reliability in cloud-based platforms as thousands and even millions of software deployments may be active at a given time. In general, an orchestration system coordinates active software deployments across computing resources (e.g., nodes within a cluster) based on the availability of those computing resources and a resource requirement request of each software deployment.

SUMMARY

The disclosed techniques improve the functionality of cloud-based platforms by the introduction of an evaluation system that realistically simulates a live deployment environment to accurately evaluate resource recommendations for orchestration systems. As described herein, a system can generate a simulated computing environment based on system characteristics extracted from currently available computing resources. In Kubernetes, for instance, the available computing resources can be referred to herein as clusters. The simulated computing environment can be utilized to evaluate resource requirement recommendations which are received from a predictive model. The system characteristics can include potential performance bottlenecks related to central processing units (CPUs), memory, or storage.

The system is configured to sample active software deployments to capture a snapshot of current activity within a cloud-based platform. This is referred to herein as an activity dataset. The activity dataset can describe various aspects such as allocation of resources, resource utilization, and other performance metrics associated with the sampled active software deployments. The activity dataset can be sampled for a specified timeframe and utilize any suitable sampling algorithm, such as Gibbs sampling. The activity dataset can then be used to configure the simulated computing environment and generate various scenarios for evaluating a resource requirement recommendation.

Once the simulated computing environment is configured using the system characteristics and the activity dataset, the system can execute a pending software deployment for evaluation purposes prior to active deployment. In various examples, the simulated computing environment includes a simulated scheduler that mimics the behavior of the orchestration system scheduler. The simulated scheduler is configured to assign instances of the pending software deployment (e.g., containers in Kubernetes) to the simulated computing environment according to the resource requirement recommendation. For instance, in Kubernetes, one or more of these containers can form a pod. Various pods can execute at a node which can represent a unit of computing resource (e.g., one virtual machine). Finally, a collection of these nodes can accordingly form a cluster such as a datacenter.

After assigning the pending software deployment, the system is configured to analyze the execution activity of the various instances of the pending software deployment within the simulated computing environment. Accordingly, the system is configured to calculate resource utilization of the resource requirement recommendation for the pending software deployment across various scenarios. The system is configured to then determine whether performance of the pending software deployment, as subject to the resource requirement recommendation, is or was acceptable. For instance, the system may be configured with a threshold level of resource utilization for each software deployment to ensure that computing resources of a cloud-based platform are fully utilized.

The disclosed techniques address several challenges that arise in the management of cloud-based platforms. For example, while orchestration systems greatly alleviate the burden of managing software deployments, the orchestration systems typically rely upon resource requirement requests that are manually configured based on a rough estimate of a software deployment's needs. As such, to prevent resource starvation, these resource requirement requests typically far exceed the actual needs of the software deployment. Unfortunately, configuring computing resources in this way frequently leads to low resource utilization as well as low resource availability. Stated another way, as software deployments typically overestimate resource requirements to ensure smooth operation, a large amount of computing resources goes unused thereby causing excessive energy usage, increased operating costs, and lost revenue.

To combat the aforementioned low utilization, many cloud service providers utilize various predictive techniques, such as machine learning, to analyze pending software deployments and predict resource requirements. In these types of scenarios, a predictive model can be trained using historical usage data of computing resources from past software deployments. Naturally, the predictions (e.g., recommendations or usage models) generated by these types of predictive models must be evaluated for accuracy prior to deployment in a live context. To this end, a portion of the usage data can be designated as a test data set for determining if a given recommendation is likely to succeed. If the recommendation generates acceptable metrics, it may be deemed ready for deployment. For the sake of discussion, a live context, a live deployment, or a live computing environment can be software deployments, computing resources, and the like that are readily available for use by users of the cloud-based platform.

Unfortunately, training and evaluating recommendations using past data often fails to capture the unpredictable nature of a live deployment. For instance, while a recommendation may demonstrate nominal functionality in the training and testing process mentioned above, computing resources may be dynamically allocated by a scheduler of the orchestration system and modified by an autoscaling process in unexpected ways. Therefore, this evaluation method is not always dependable and introduces undue risk for deploying a resource requirement recommendation. In another example, software may be deployed in beta to evaluate a resource requirement recommendation. However, this approach can also fail to adequately evaluate a recommendation as beta deployments may not experience the same activity as a full deployment.

In addition, when various system parameters are modified according to a recommendation, the overall system behavior can change dramatically (e.g., the allocation and re-allocation of resources is excessive because a recommendation typically underutilizes allocated or re-allocated resources). In such circumstances, the system's various behaviors captured by historical usage data become irrelevant to informing of future behaviors. As such, there is a need for a framework that realistically simulates a live deployment environment and that accurately evaluates various resource requirement recommendations. In this way, a selection of a resource requirement recommendation that best suits the current behaviors of the system can be made.

In contrast to existing solutions, the system disclosed herein provides robust evaluations of resource requirement recommendations that capture the dynamic and unpredictable nature of orchestration systems. As mentioned above, typical solutions that generate and evaluate resource requirement recommendations using historical usage data often fail to account for behaviors at a current point in time. As such, the evaluation may indicate that a recommendation is correct while the recommendation is not actually suitable for the current state of a live computing environment. This can lead to overutilization of computing resources causing degradation in performance, loss of functionality, and other failures. Alternatively, a poor recommendation can lead to underutilization of computing resources resulting in wasted power and undue operating costs. Therefore, computing resource requirement recommendations that optimize resource utilization enable a cloud-based platform to provide a reliable experience for users while realizing maximum utilization of infrastructure and reducing operating costs.

As another example of the technical benefit of the present disclosure, sampling activity data from active software deployments enables the disclosed system to generate a wide variety of scenarios within the simulated computing environment. In this way, resource requirement recommendations can be evaluated across different contexts to measure the impact of a resource requirement recommendation on utilization and performance. Therefore, organizing the evaluation framework around a simulated computing environment using the sampling of live data enables robust evaluation of resource requirement recommendations.

Features and technical benefits other than those explicitly described above will be apparent from a reading of the following Detailed Description and a review of the associated drawings. This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter. The term "techniques," for instance, may refer to system(s), method(s), computer-readable instructions, module(s), algorithms, hardware logic, and/or operation(s) as permitted by the context described above and throughout the document.

BRIEF DESCRIPTION OF THE DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with a letter of a sequence of letters to refer to each individual item. Generic references to the items may use the specific reference number without the sequence of letters.

DETAILED DESCRIPTION

The techniques described herein provide systems for enhancing the functionality of cloud-based platforms by the introduction of a simulated computing environment for evaluating resource requirement recommendations. As mentioned above, the simulated computing environment can be generated based on system characteristics of currently available computing resources and activity data sampled from active software deployments.

The disclosed system addresses several technical problems associated with evaluation of resource requirement recommendations. For instance, many existing systems rely upon historical usage data from past software deployments for generating and evaluating recommendations, which often fail to capture behaviors of the cloud-based platform at the current point in time. In contrast, the disclosed system generates a simulated computing environment by sampling currently available computing resources. In this way, the simulated computing environment captures current conditions within the cloud-based platform, and enables realistic evaluation and/or comparison of resource requirement recommendations.

In addition, by organizing the evaluation around a simulated computing environment that is configured using data and metrics sampled from a live environment, evaluation can be enabled across many different scenarios. In this way, the system can measure the impact of a resource requirement recommendation on performance of the cloud-based platform. Consequently, evaluations are much more thorough and robust in comparison to existing systems which often only utilize a single scenario as defined by historical usage data.

Various examples, scenarios, and aspects that enable robust evaluation of resource requirement recommendations are described below with respect to FIGS. 1A-7.

Figure 1A:
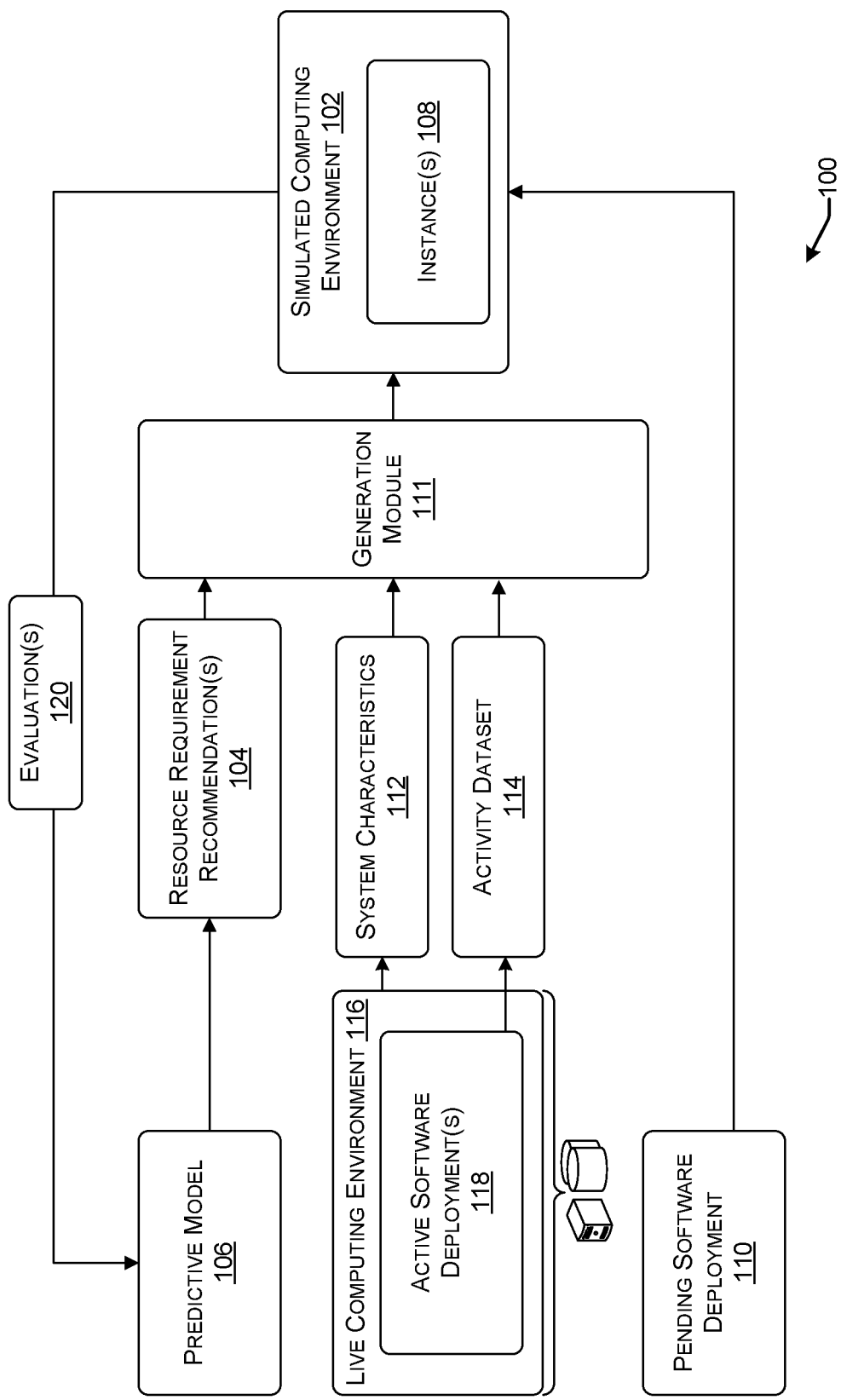
FIG. 1A is a block diagram of a system for evaluating resource requirement recommendations.

FIG. 1A illustrates an example system 100 in which a simulated computing environment 102 is constructed to evaluate a resource requirement recommendation 104 that is generated by a predictive model 106. As will be described further below, the resource requirement recommendation 104 defines an amount of computing resource that is to be reserved for an instance 108 of a pending software deployment 110. A pending software deployment 110 can be infrastructure configured to execute a program (e.g., a container, a virtual machine). In various examples, resources include any virtual and/or physical components that enable or execute a software deployment such as computing cores, storage, or memory (e.g., random-access memory (RAM)). Accordingly, the resource requirement recommendation 104 includes a set of predicted resource requirements defining quantities for each resource, such as a number of computing cores, a volume of storage, or an amount of memory. As mentioned above, an instance 108 can be a pod or a container in some contexts (e.g., Kubernetes). Alternatively, an instance 108 can be understood to be a genus in which the pod or the container are species. In some examples, the simulated computing environment 102 comprises a single node (e.g., a single physical machine and/or virtual machine) to form a miniature cluster. In this way, test deployments for evaluating a resource requirement recommendation 104 can be performed quickly, and thus, many iterations and situations can be simulated.

To generate the simulated computing environment 102, a generation module 111 of the system 100 can extract system characteristics 112 from a live computing environment 116. Moreover, the generation module 111 can extract an activity dataset 114 from active software deployments 118 within the live computing environment 116. Once configured with the system characteristics 112 and the activity dataset 114, instances 108 of the pending software deployment 110 can be assigned to the simulated computing environment 102 according to the resource requirement recommendation 104. The simulated computing environment 102 can subsequently analyze the operation of instances 108 to generate an evaluation 120 defining various metrics of the instances 108 such as resource underutilization, overutilization, and the like.

Figure 1B:
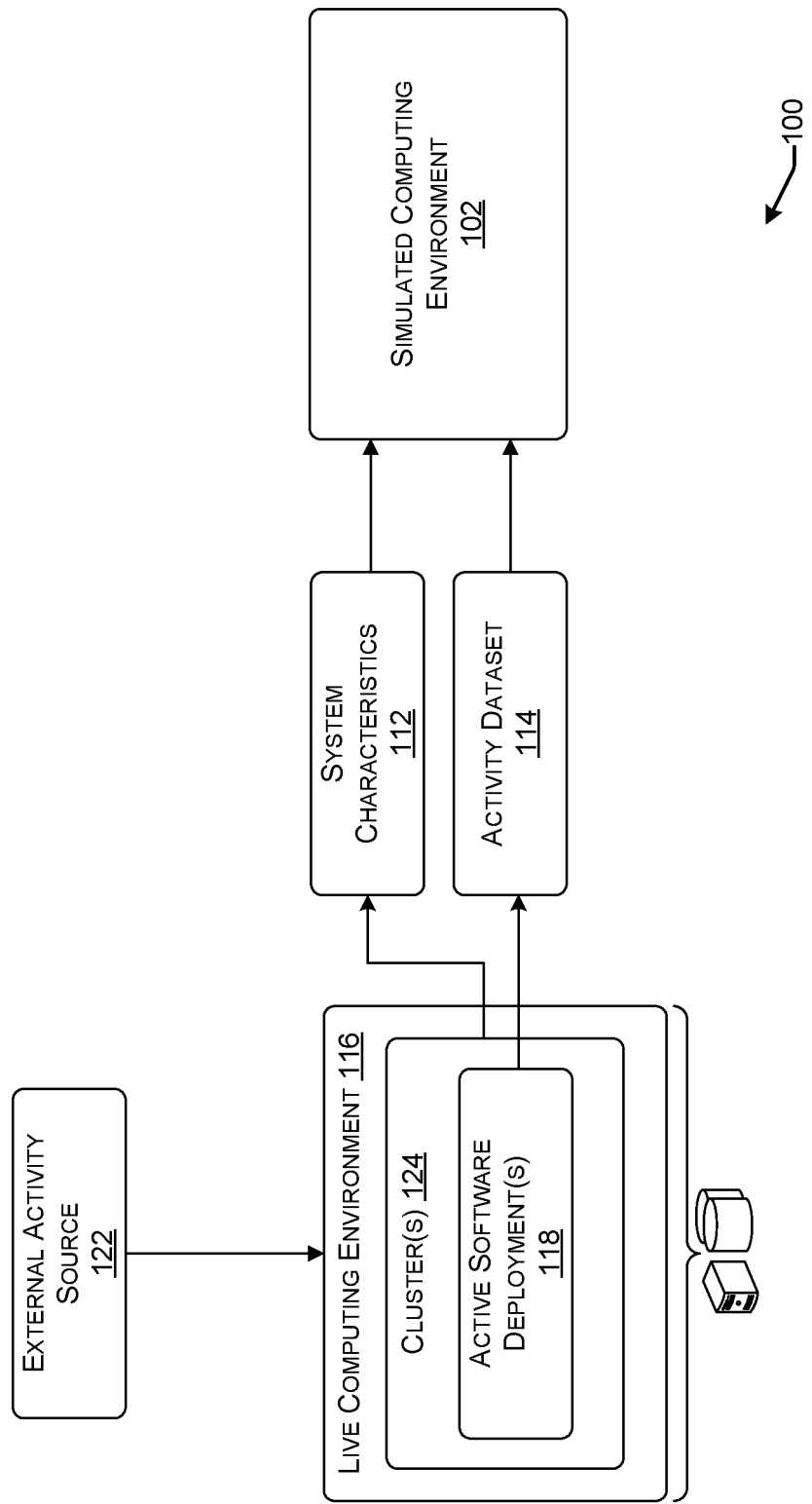
FIG. 1B illustrates a first state in the operation of the system for evaluating resource requirement recommendations using a simulated computing environment.

Turning now to FIG. 1B, a first step of the process for evaluating a resource requirement recommendation 104 is shown and described with additional details regarding various elements of FIG. 1A. As mentioned above, the live computing environment 116 can be any portion of a cloud-based platform that is readily accessible and can receive traffic and/or activity from external sources 122 such as users (e.g., customers). The live computing environment 116 can include various computing resources such as clusters 124 that are comprised of nodes which execute the active software deployments 118. The active software deployments 118 can include applications, services, databases, and other software that utilizes the live computing environment 116.

By configuring the simulated computing environment 102 using system characteristics 112 that are retrieved, e.g., in real-time or near real-time, the generation module 111 can generate a simulated computing environment 102 that closely mirrors the live computing environment 116. Similarly, the activity dataset 114 can be sampled from some or all of the active software deployments 118 to observe various aspects such as resource utilization of active containers, the distribution of nodes within the live computing environment 116 as dictated by a scheduler, and other measures of activity. The resource utilization is a measure of the quantity of computing resources currently and actually utilized in relation to the amount of reserved computing resources (e.g., twenty-five percent). In addition, a scheduler can be any component, physical and/or virtual, that assigns software deployments to various computing resources for execution based on their associated resource requests.

The activity dataset 114 can be utilized by the generation module 111 to generate many test scenarios which can be utilized by the simulated computing environment 102 to evaluate the resource requirement recommendation 104. In a test scenario, values in the activity dataset 114 can be slightly modified to provide an alternative simulation (e.g., the values in the activity dataset are modified to be plus and/or minus 5% of their previous values). Accordingly, more test scenarios with varied activity datasets can provide a more comprehensive understanding of how a resource requirement recommendation performs. In addition, the test scenarios can also be augmented using historical data from previous software deployments defining resource utilization of individual instances (e.g., containers). In this way, the simulated computing environment 102 can produce robust evaluations 120 that can fully capture the impact of the resource requirement recommendation 104 on resource utilization, and thus, overall performance.

In addition, the activity dataset 114 can be sampled for a specified time period (e.g., thirty seconds, one minute, two minutes). In various examples, the time period is manually configured by a system engineer or another administrative entity. Alternatively, the time period can be automatically determined by the generation module 111 based on various factors such as previous sampling times, an average sampling time, a random sampling algorithm, and so forth.

Figure 1C:
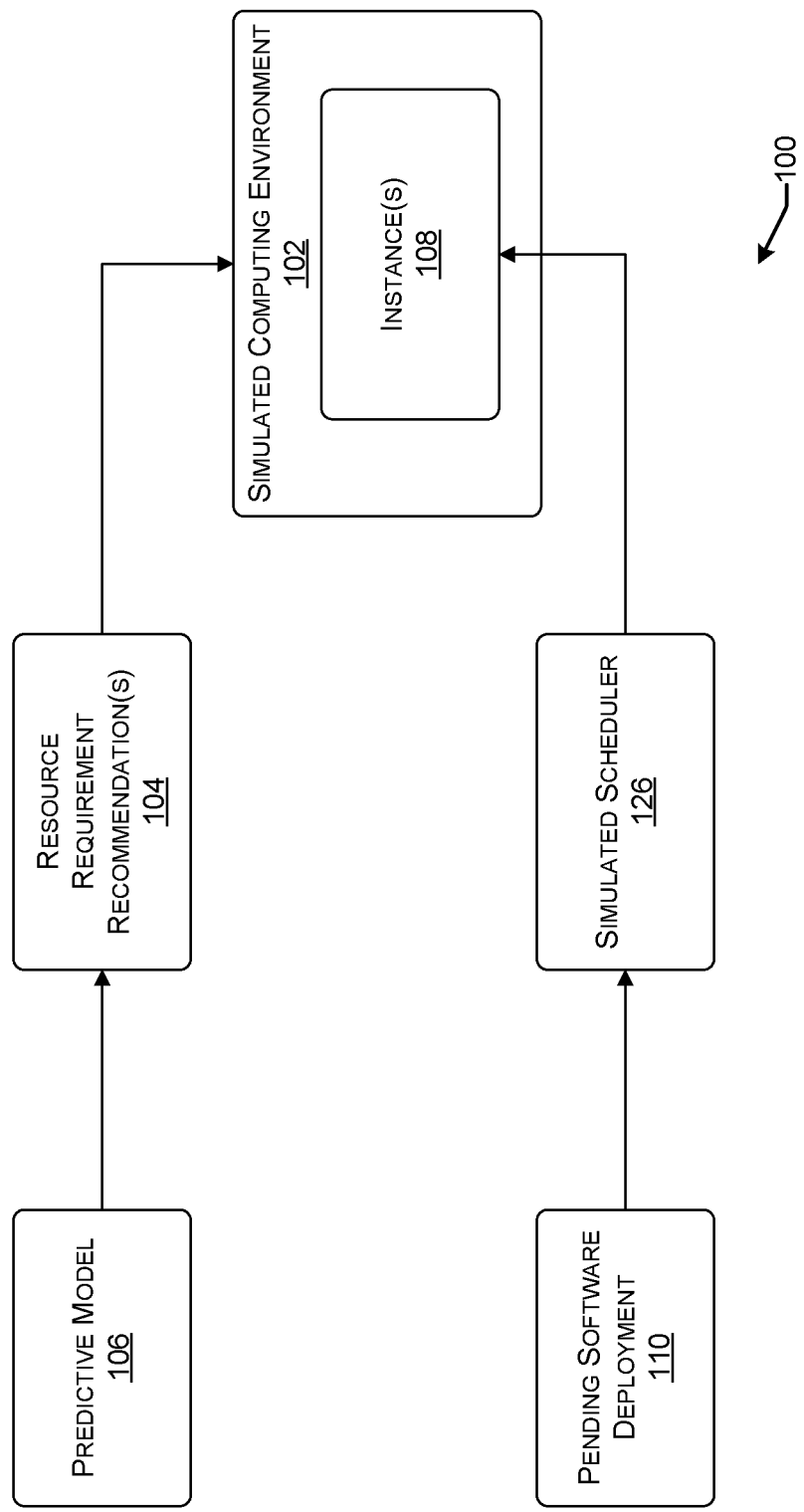
FIG. 1C illustrates a second state in the operation of the system for evaluating resource requirement recommendations using a simulated computing environment.

Turning now to FIG. 1C, once the simulated computing environment 102 is configured with the system characteristics 112 and the activity dataset 114, various instances 108 of the pending software deployment 110 can be assigned to the simulated computing environment 102 based on a resource requirement recommendation 104. As mentioned above, the resource requirement recommendation 104 can be generated by a predictive model 106 such as a machine learning model or other data-driven method. In addition, as will be elaborated upon further below, the resource requirement recommendation 104 can define various amounts of computing resources that are to be reserved for each instance 108 of the pending software deployment 110. Furthermore, a simulated scheduler 126 can be used assign instance(s) 108 of the pending software deployment 110 to the simulated computing environment 102. The simulated scheduler 126 can be generated based on the activity dataset 114 extracted from the live computing environment 116. In this way, the simulated scheduler 126 can closely mimic the behavior of the scheduler within the live computing environment 116. It should be understood that the simulated scheduler can be generated using any suitable method.

In a specific example, a resource requirement recommendation 104 defines that each instance 108 is to receive two computing cores. As mentioned above, the simulated computing environment 102 may comprise a single node representing a physical machine or a virtual machine. In this example, the node is a virtual machine containing eight computing cores. Accordingly, the simulated scheduler 126 can assign four instances 108 of the pending software deployment 110 to the simulated computing environment 102. The system 100 can then analyze the resource utilization of the instances 108 to determine if two computing cores is an appropriate amount of computing resource for each instance 108.

Furthermore, the system 100 can be configured to simultaneously evaluate multiple resource requirement recommendations 104. For instance, while one resource requirement recommendation 104 may reserve two computing cores for each instance 108, another resource requirement recommendation 104 may only reserve one computing core, and still another reserves four computing cores. Accordingly, the simulated scheduler 126 can assign instances 108 of the pending software deployment 110 to the simulated computing environment 102 according to each resource requirement recommendation 104. The system 100 can analyze and compare the performance of each resource requirement recommendation 104 within the simulated computing environment 102. The simulated computing environment 102 can be configured with simulated resources based on the number of resource requirement recommendations 104 that are to be evaluated.

Figure 1D:
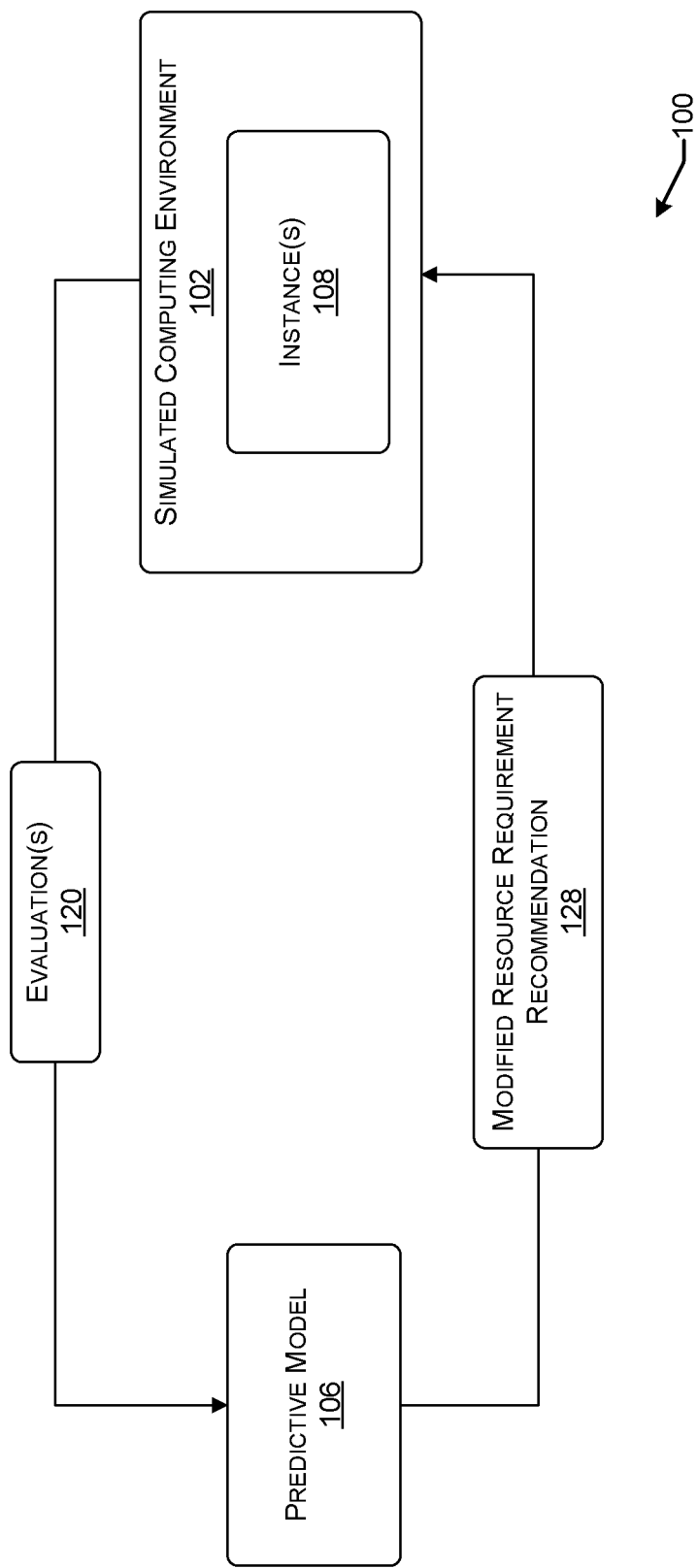
FIG. 1D illustrates a third state in the operation of the system for evaluating resource requirement recommendations using a simulated computing environment.

Once the simulated scheduler 126 has occupied available resources with instances 108 of the pending software deployment 110 according to the resource requirement recommendation 104, the simulated computing environment 102 may then generate an evaluation 120 for the resource requirement recommendation 104, as shown in FIG. 1D. The evaluation 120 defines various performance metrics such as resource utilization. The evaluation 120 can be accordingly fed back to the predictive model 106 that originally generated the resource requirement recommendation 104. Accordingly, the predictive model 106 can utilize the evaluation 120 to generate a modified resource requirement recommendation 128. In various examples, the modified resource requirement recommendation 128 defines a changed allocation of resources for each instance 108. The modified resource requirement recommendation 128 can subsequently be evaluated within the simulated computing environment 102. In this way, evaluations 120 can inform subsequent iterations of resource requirement recommendations 104 and continually improve over time to maximize the utilization of computing resources.

Figure 2:
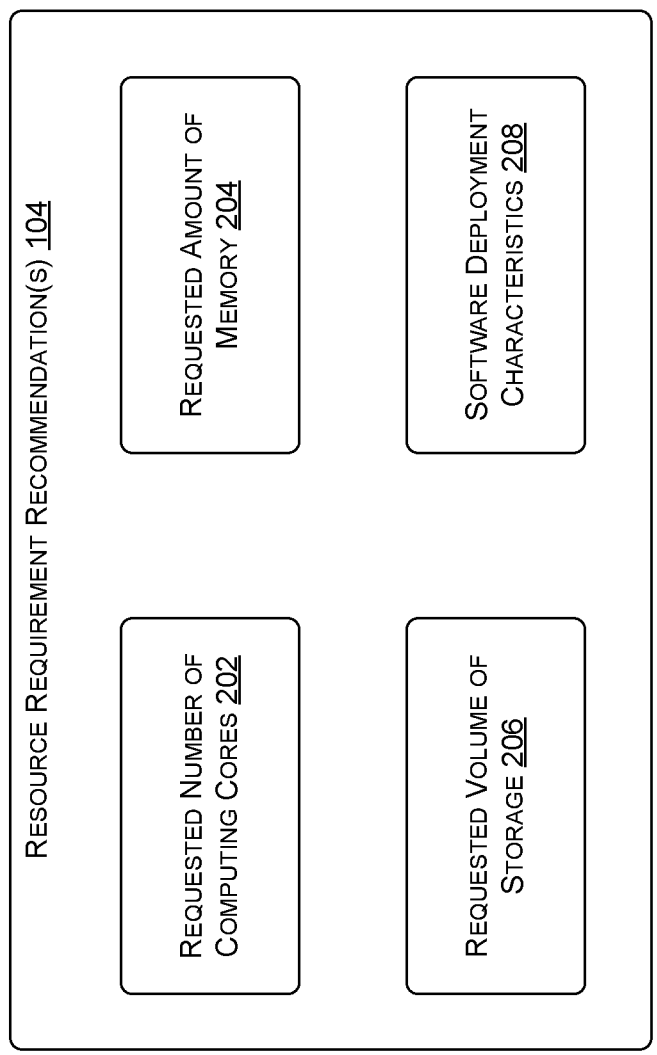
FIG. 2 illustrates various aspects of a resource requirement recommendation.

Turning now to FIG. 2, additional aspects of a resource requirement recommendation 104 are shown and described. As mentioned above, a resource requirement recommendation 104 can define an amount of computing resource that is reserved for each instance 108 of a pending software deployment 110. In specific examples, the computing resource reservation includes a requested number of computing cores 202, a requested amount of memory 204, and a requested volume of storage 206. The resource requests 202-206 can be configured based on software deployment characteristics 208 that define various aspects of the pending software deployment 110. For example, the software deployment characteristics 208 may indicate that the pending software deployment 110 is not very computationally intensive but performs frequent memory operations. Accordingly, the requested computing cores 202 may be a single core while the requested memory 204 may be two gigabytes.

In another example, the software deployment characteristics 208 indicate that the pending software deployment 110 generates a significant amount of data which must be stored. As such, the requested volume of storage 206 may be set to one hundred gigabytes. In addition, resource requirement recommendation 104 can be configured with default values for the resource requests 202-206. In the current example, the requested computing cores 202 default to a single core while the requested memory 204 defaults to 256 megabytes.

Figure 3A:
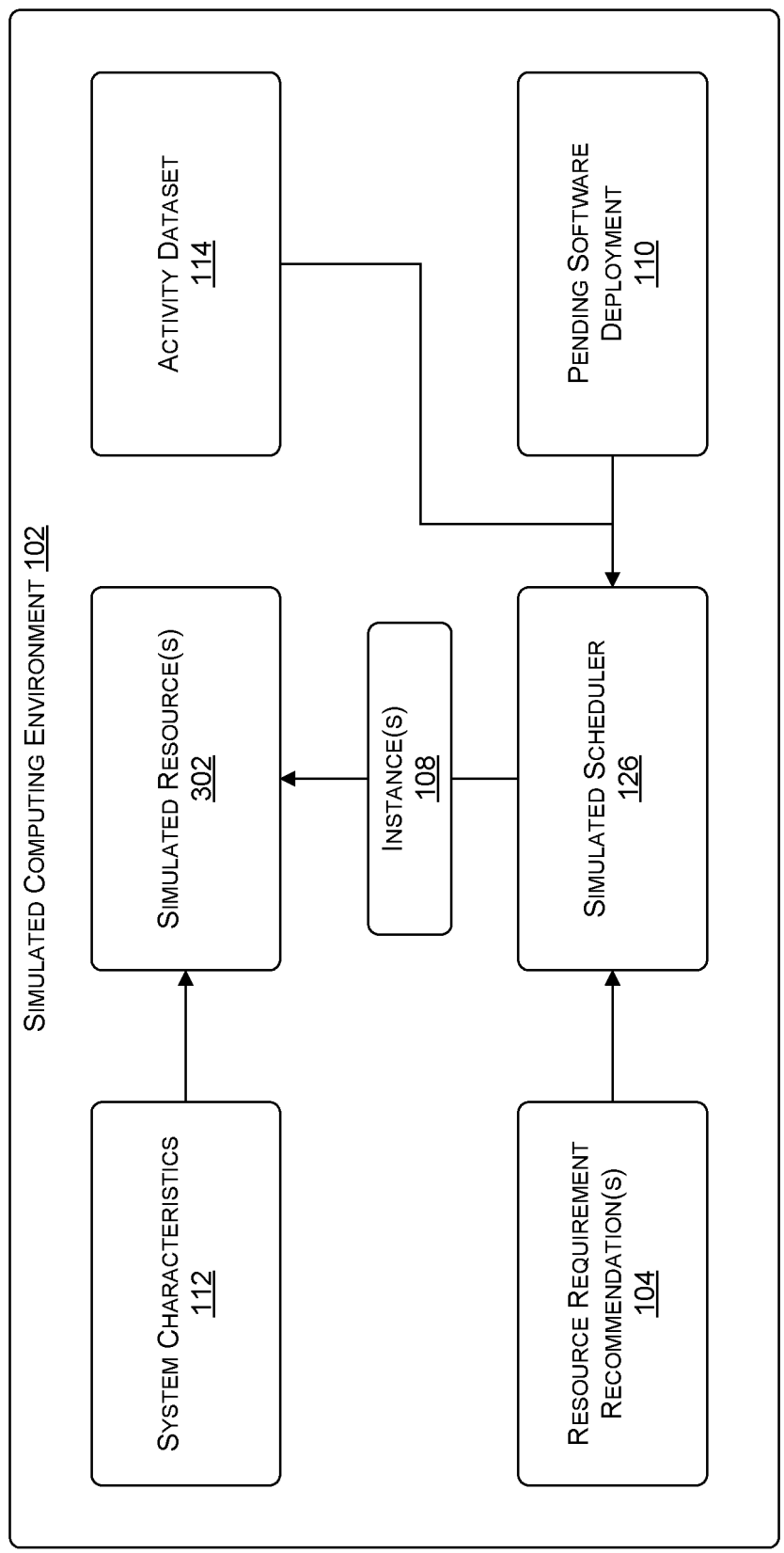
FIG. 3A illustrates various aspects of a simulated computing environment.

Turning now to FIG. 3A, aspects of a simulated computing environment 102 are shown and described. As described above, system characteristics 112 and an activity dataset 114 can be sampled from a live computing environment 116 to ensure the simulated computing environment 102 closely resembles current conditions and can provide a realistic evaluation of a resource requirement recommendation 104. For instance, the system characteristics 112 can define available computing resources such as computing cores, memory, and storage of a cluster within the live computing environment 116. Accordingly, the simulated resources 302 can be configured to mirror the resource availability observed within the live computing environment 116.

In addition, the simulated computing environment 102 includes a simulated scheduler 126 that can be configured using the activity dataset 114. For instance, the activity dataset 114 can define a distribution of nodes within the live computing environment 116 as dictated by a scheduler. Accordingly, the activity dataset 114 can be used to configure the simulated scheduler 126 to mimic this observed behavior of the scheduler within the live computing environment 116.

Once configured, the simulated scheduler 126 can receive a pending software deployment 110 and proceed to assign instance(s) 108 of the pending software deployment 110 to the simulated resource(s) 302. As discussed above, the instances 108 of the pending software deployment 110 can be assigned by the simulated scheduler 126 according to resource requests 202-206 defined by an associated resource requirement recommendation 104 until all available simulated resources 302 are fully reserved. In addition, as mentioned above, the simulated computing environment 102 can be configured to evaluate and compare multiple resource requirement recommendations 104.

Figure 3B:
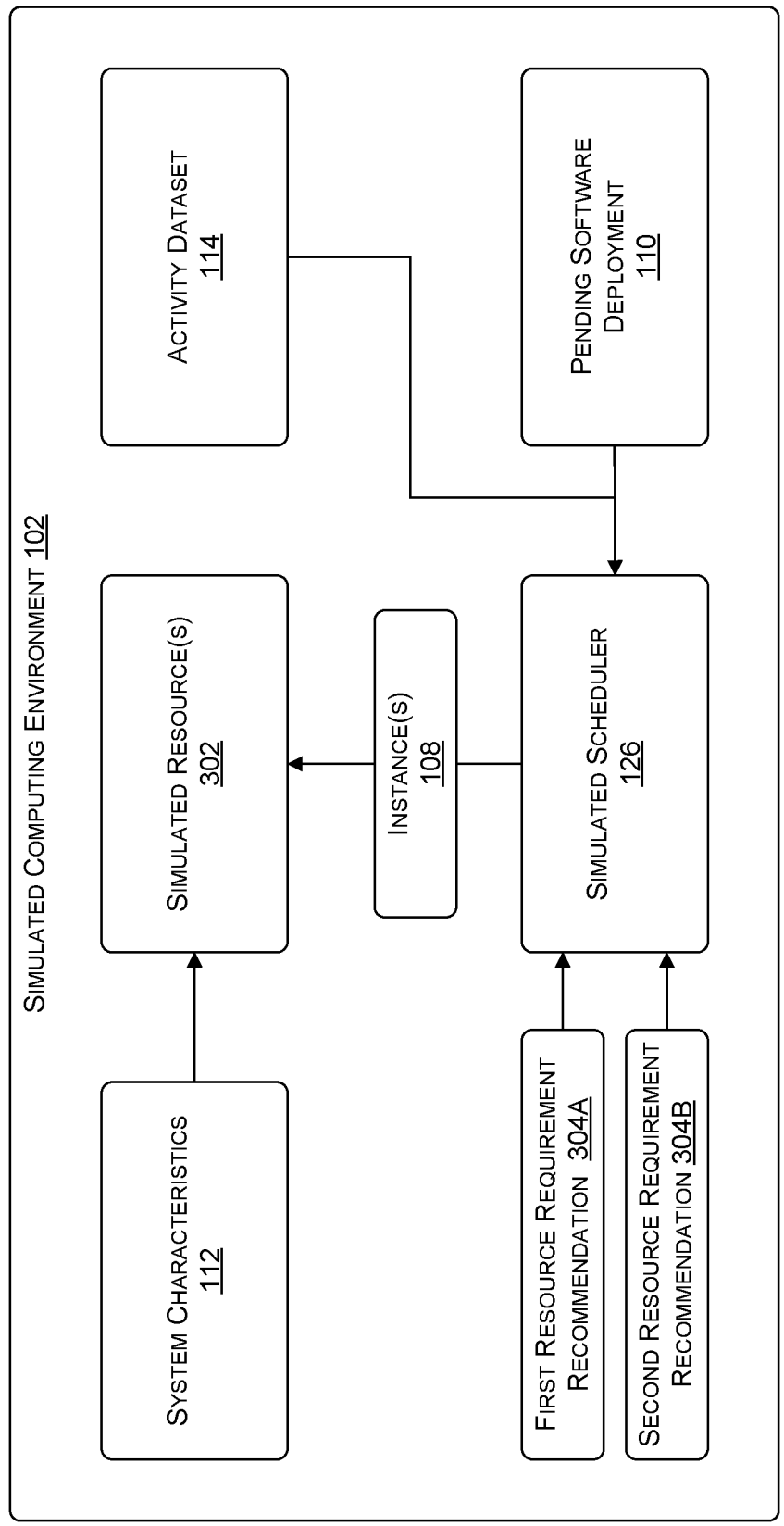
FIG. 3B illustrates additional aspects of the simulated computing environment.

To ensure that comparison of various resource requirement recommendations 104 is accurate, the list of allocated instance(s) 108 for each resource requirement recommendation 104 can be a superset of allocated instances for resource requirement recommendations 104 with lower utilization. For example, as shown in FIG. 3B, consider a first resource requirement recommendation 304A that defines resource requests 202-206 such that the simulated scheduler 126 can only assign two instances 108 of the pending software deployment 110 to the simulated resources 302, and each of the two instances receives six cores of twelve available cores. Conversely, a second resource requirement recommendation 304B may define resource requests 202-206 such that the simulated scheduler 126 is able to assign three instances 108 of the pending software deployment 110 to the simulated resources 302, and each of the three instances receives four cores of the twelve available cores. In this example, the two instances 108 of the first resource requirement recommendation 304A would also be considered as part of the three instances 108 of the second resource requirement recommendation 304B. Stated alternatively, the second resource requirement recommendation 304B is a superset of the first resource requirement recommendation 304A (e.g., the lower utilization resource requirement recommendation). In this way, irrelevant differences between various instances 108 can be effectively neutralized when comparing resource requirement recommendations 104 such that each resource requirement recommendation 104 is compared under the same circumstances.

Figure 4:
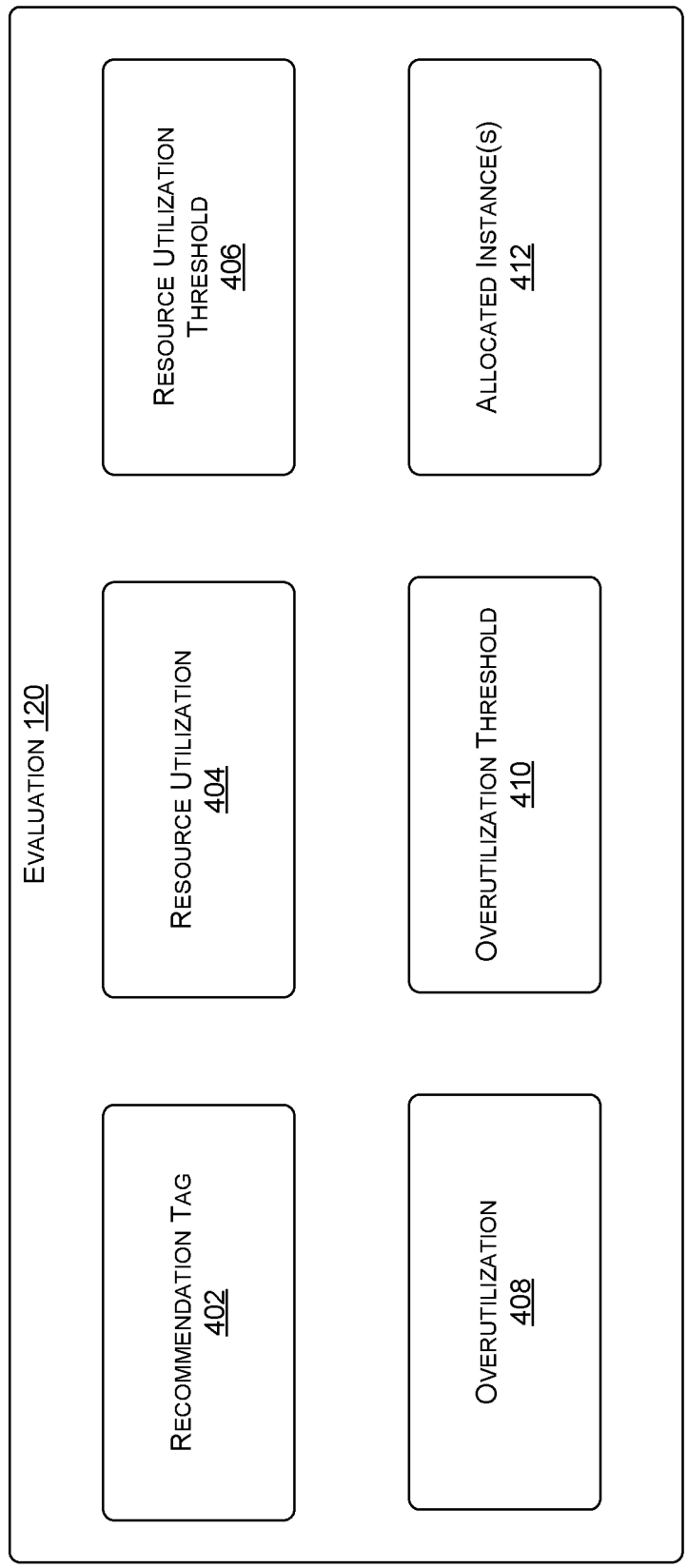
FIG. 4 illustrates various aspects of an evaluation of a resource requirement recommendation.

Proceeding now to FIG. 4, aspects of an evaluation 120 for a resource requirement recommendation 104 are shown and described. As described above, the simulated computing environment 102 can generate an evaluation 120 for an associated resource requirement recommendation 104 which can be identified with a recommendation tag 402. In addition, the evaluation 120 can include metrics for resource utilization 404. In various examples, resource utilization 404 is a measure of the resource(s) used relative to an amount of computing resource that was reserved by the associated resource requirement recommendation 104. This can be represented using a normalized value (e.g., 0.75), a percentage, or any other suitable format.

Furthermore, the evaluation 120 may include a resource utilization threshold 406 that can be utilized to analyze various resource requirement recommendations 104. In addition, the resource utilization threshold 406 can be used to determine whether the simulated resources 302 can accommodate additional instances of the pending software deployment 110. For example, as the simulated scheduler 126 populates the simulated resources 302 in the simulated computing environment 102, the resource utilization 404 increases accordingly. In various examples, while the resource utilization 404 is below the resource utilization threshold 406 the simulated resources 302 have capacity for at least one additional instance 108 of the pending software deployment 110. As such, the simulated scheduler 126 can assign an additional instance 108 of the pending software deployment 110.

The evaluation 120 can also include metrics of overutilization 408 that track occasions where resource utilization 404 exceeds the amount allotted by the associated resource requirement recommendation 104. The evaluation 120 can also include a corresponding overutilization threshold 410, which can indicate that the resource utilization 404 has exceeded the allotted resources an excessive number of times (e.g., four times, seven times, ten times). For instance, a resource requirement recommendation 104 may allot one gigabyte of memory for each instance 108. If the instances 108 of the software deployment 110 routinely exceed the memory limit, the evaluation 120 may indicate that the resource requirement recommendation 104 is unsuitable for the pending software deployment.

Alternatively, the overutilization threshold 410 may indicate that the resource utilization 404 has exceeded the allotted resources by an excessive amount (e.g., 10%, 20%, 50%). Consider again the memory example above. While the instances 108 of the pending software deployment 110 may not exceed the one gigabyte limit frequently, the instances 108 may greatly exceed the limit in a specific occasion. For example, an instance 108 may suddenly consume four gigabytes of memory. Accordingly, this particularly egregious violation of the resource limits can be recorded by the overutilization threshold 410.

In various examples, if the evaluation 120 indicates the resource utilization 404 exceeds the overutilization threshold 410, then the resource requirement recommendation being evaluated can be removed from consideration when selecting a resource requirement recommendation that best fits the current system behaviors.

Furthermore, the evaluation 120 can include a list of allocated instances 412 that were assigned by the simulated scheduler 126. As mentioned above, this list of allocated instances 412 can also be shared between evaluations 120 such that the list of allocated instances 412 for resource requirement recommendations 104 with greater utilization include the allocated instances 412 of those with lower utilization. In this way, the system 100 can ensure comparisons between resource requirement recommendations are accurate.

Figure 5:
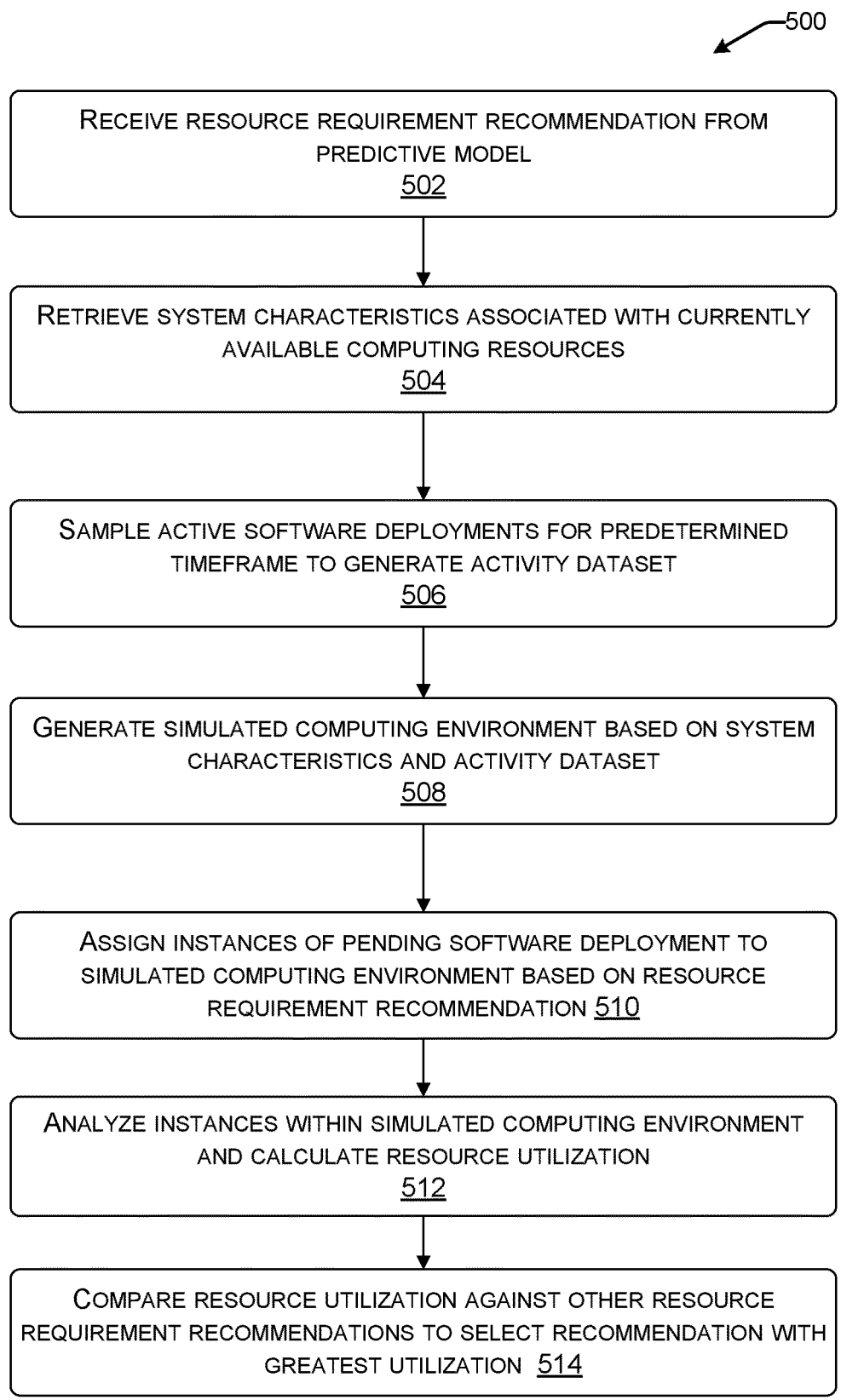
FIG. 5 is a flow diagram showing aspects of a routine for evaluating resource requirement recommendations using a simulated computing environment.

Turning now to FIG. 5, aspects of a routine 500 for enabling robust evaluation of resource requirement recommendations using a simulated computing environment are described. With reference to FIG. 5, routine 500 begins at operation 502 where a system receives a resource requirement recommendation from a predictive model. As discussed above, the predictive model may be a machine learning model or any suitable data-driven model (e.g., the Holt-Winters prediction model).

Next at operation 504, the system retrieves system characteristics from currently available computing resources such as a live computing environment.

Proceeding to operation 506, the system then samples active software deployments for a predetermined timeframe to generate an activity dataset.

Then at operation 508, the system generates a simulated computing environment based on the system characteristics and the activity dataset.

Next at operation 510, the system assigns instances of a pending software deployment to the simulated computing environment based the resource requirement recommendation.

At operation 512, the system analyzes the instances of the pending software deployment within the simulated computing environment and calculates a level of resource utilization.

Finally, at operation 514, the measured resource utilization of the resource requirement recommendation is compared against other recommendations and the resource requirement recommendation with the greatest utilization is selected from the group.

For ease of understanding, the processes discussed in this disclosure are delineated as separate operations represented as independent blocks. However, these separately delineated operations should not be construed as necessarily order dependent in their performance. The order in which the process is described is not intended to be construed as a limitation, and any number of the described process blocks may be combined in any order to implement the process or an alternate process. Moreover, it is also possible that one or more of the provided operations is modified or omitted.

The particular implementation of the technologies disclosed herein is a matter of choice dependent on the performance and other requirements of a computing device. Accordingly, the logical operations described herein are referred to variously as states, operations, structural devices, acts, or modules. These states, operations, structural devices, acts, and modules can be implemented in hardware, software, firmware, in special-purpose digital logic, and any combination thereof. It should be appreciated that more or fewer operations can be performed than shown in the figures and described herein. These operations can also be performed in a different order than those described herein.

It also should be understood that the illustrated methods can end at any time and need not be performed in their entireties. Some or all operations of the methods, and/or substantially equivalent operations, can be performed by execution of computer-readable instructions included on a computer-storage media, as defined below. The term "computer-readable instructions," and variants thereof, as used in the description and claims, is used expansively herein to include routines, applications, application modules, program modules, programs, components, data structures, algorithms, and the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, and the like.

Thus, it should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as states, operations, structural devices, acts, or modules. These operations, structural devices, acts, and modules may be implemented in software, in firmware, in special purpose digital logic, and any combination thereof.

For example, the operations of the routine 500 can be implemented, at least in part, by modules running the features disclosed herein can be a dynamically linked library (DLL), a statically linked library, functionality produced by an application programing interface (API), a compiled program, an interpreted program, a script or any other executable set of instructions. Data can be stored in a data structure in one or more memory components. Data can be retrieved from the data structure by addressing links or references to the data structure.

Although the illustration may refer to the components of the figures, it should be appreciated that the operations of the routine 500 may be also implemented in many other ways. For example, the routine 500 may be implemented, at least in part, by a processor of another remote computer or a local circuit. In addition, one or more of the operations of the routine 500 may alternatively or additionally be implemented, at least in part, by a chipset working alone or in conjunction with other software modules. In the example described below, one or more modules of a computing system can receive and/or process the data disclosed herein. Any service, circuit or application suitable for providing the techniques disclosed herein can be used in operations described herein.

Figure 6:
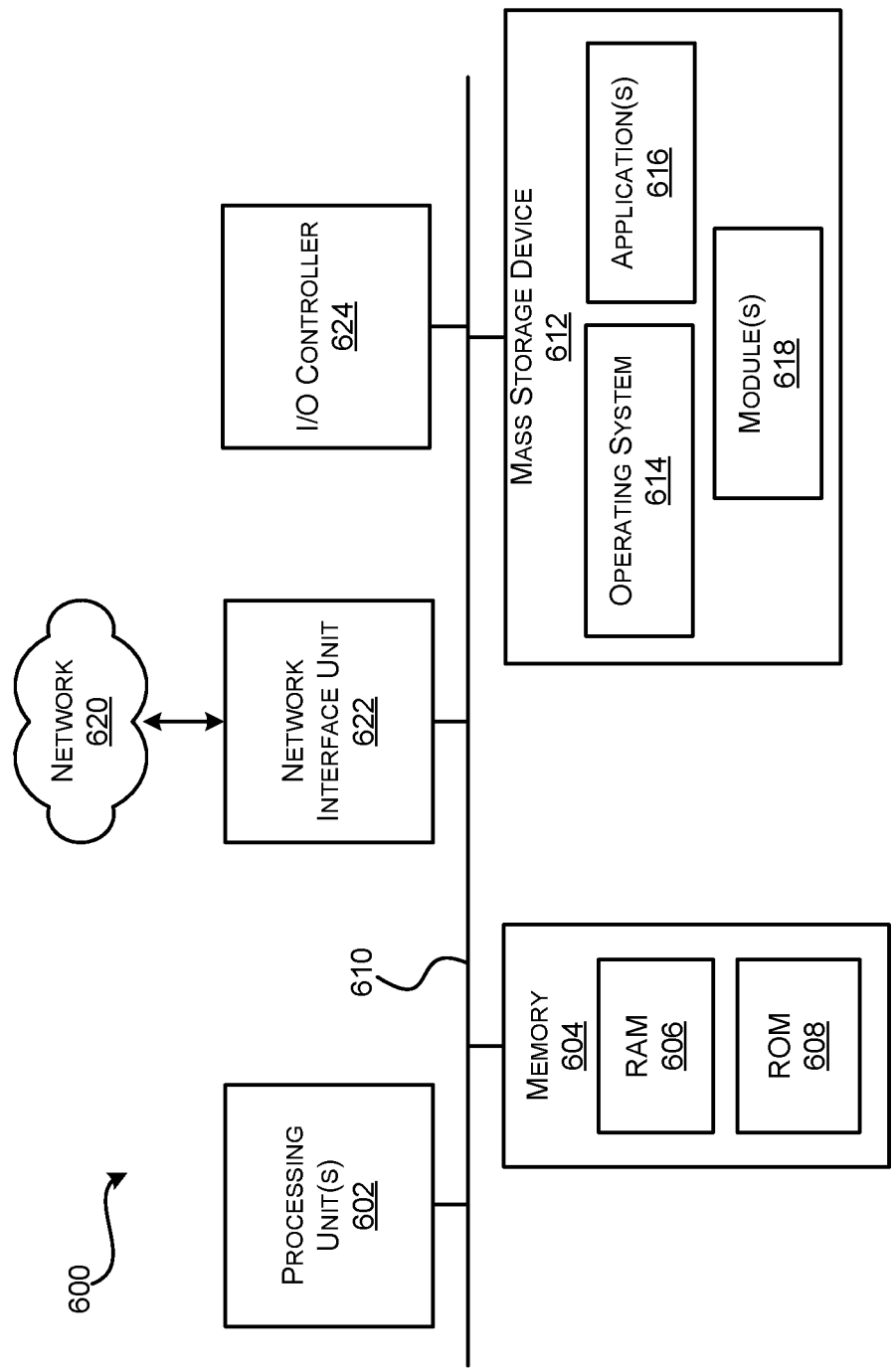
FIG. 6 is a computer architecture diagram showing an illustrative computer hardware and software architecture for a computing system capable of implementing aspects of the techniques and technologies presented herein.

FIG. 6 shows additional details of an example computer architecture 600 for a device, such as a computer or a server configured as part of the cloud-based platform or system 100, capable of executing computer instructions (e.g., a module or a program component described herein). The computer architecture 600 illustrated in FIG. 6 includes processing unit(s) 602, a system memory 604, including a random-access memory 606 (RAM) and a read-only memory (ROM) 608, and a system bus 610 that couples the memory 604 to the processing unit(s) 602. The processing units 602 may also comprise or be part of a processing system. In various examples, the processing units 602 of the processing system are distributed. Stated another way, one processing unit 602 of the processing system may be located in a first location (e.g., a rack within a datacenter) while another processing unit 602 of the processing system is located in a second location separate from the first location.

Processing unit(s), such as processing unit(s) 602, can represent, for example, a CPU-type processing unit, a GPU-type processing unit, a field-programmable gate array (FPGA), another class of digital signal processor (DSP), or other hardware logic components that may, in some instances, be driven by a CPU. For example, illustrative types of hardware logic components that can be used include Application-Specific Integrated Circuits (ASICs), Application-Specific Standard Products (ASSPs), System-on-a-Chip Systems (SOCs), Complex Programmable Logic Devices (CPLDs), and the like.

A basic input/output system containing the basic routines that help to transfer information between elements within the computer architecture 600, such as during startup, is stored in the ROM 608. The computer architecture 600 further includes a mass storage device 612 for storing an operating system 614, application(s) 616, modules 618, and other data described herein.

The mass storage device 612 is connected to processing unit(s) 602 through a mass storage controller connected to the bus 610. The mass storage device 612 and its associated computer-readable media provide non-volatile storage for the computer architecture 600. Although the description of computer-readable media contained herein refers to a mass storage device, it should be appreciated by those skilled in the art that computer-readable media can be any available computer-readable storage media or communication media that can be accessed by the computer architecture 600.

Computer-readable media can include computer-readable storage media and/or communication media. Computer-readable storage media can include one or more of volatile memory, nonvolatile memory, and/or other persistent and/or auxiliary computer storage media, removable and non-removable computer storage media implemented in any method or technology for storage of information such as computer-readable instructions, data structures, program modules, or other data. Thus, computer storage media includes tangible and/or physical forms of media included in a device and/or hardware component that is part of a device or external to a device, including RAM, static RAM (SRAM), dynamic RAM (DRAM), phase change memory (PCM), ROM, erasable programmable ROM (EPROM), electrically EPROM (EEPROM), flash memory, compact disc read-only memory (CD-ROM), digital versatile disks (DVDs), optical cards or other optical storage media, magnetic cassettes, magnetic tape, magnetic disk storage, magnetic cards or other magnetic storage devices or media, solid-state memory devices, storage arrays, network attached storage, storage area networks, hosted computer storage or any other storage memory, storage device, and/or storage medium that can be used to store and maintain information for access by a computing device.

In contrast to computer-readable storage media, communication media can embody computer-readable instructions, data structures, program modules, or other data in a modulated data signal, such as a carrier wave, or other transmission mechanism. As defined herein, computer storage media does not include communication media. That is, computer-readable storage media does not include communications media consisting solely of a modulated data signal, a carrier wave, or a propagated signal, per se.

According to various configurations, the computer architecture 600 may operate in a networked environment using logical connections to remote computers through the network 620. The computer architecture 600 may connect to the network 620 through a network interface unit 622 connected to the bus 610. The computer architecture 600 also may include an input/output controller 624 for receiving and processing input from a number of other devices, including a keyboard, mouse, touch, or electronic stylus or pen. Similarly, the input/output controller 624 may provide output to a display screen, a printer, or other type of output device.

It should be appreciated that the software components described herein may, when loaded into the processing unit(s) 602 and executed, transform the processing unit(s) 602 and the overall computer architecture 600 from a general-purpose computing system into a special-purpose computing system customized to facilitate the functionality presented herein. The processing unit(s) 602 may be constructed from any number of transistors or other discrete circuit elements, which may individually or collectively assume any number of states. More specifically, the processing unit(s) 602 may operate as a finite-state machine, in response to executable instructions contained within the software modules disclosed herein. These computer-executable instructions may transform the processing unit(s) 602 by specifying how the processing unit(s) 602 transition between states, thereby transforming the transistors or other discrete hardware elements constituting the processing unit(s) 602.

Figure 7:
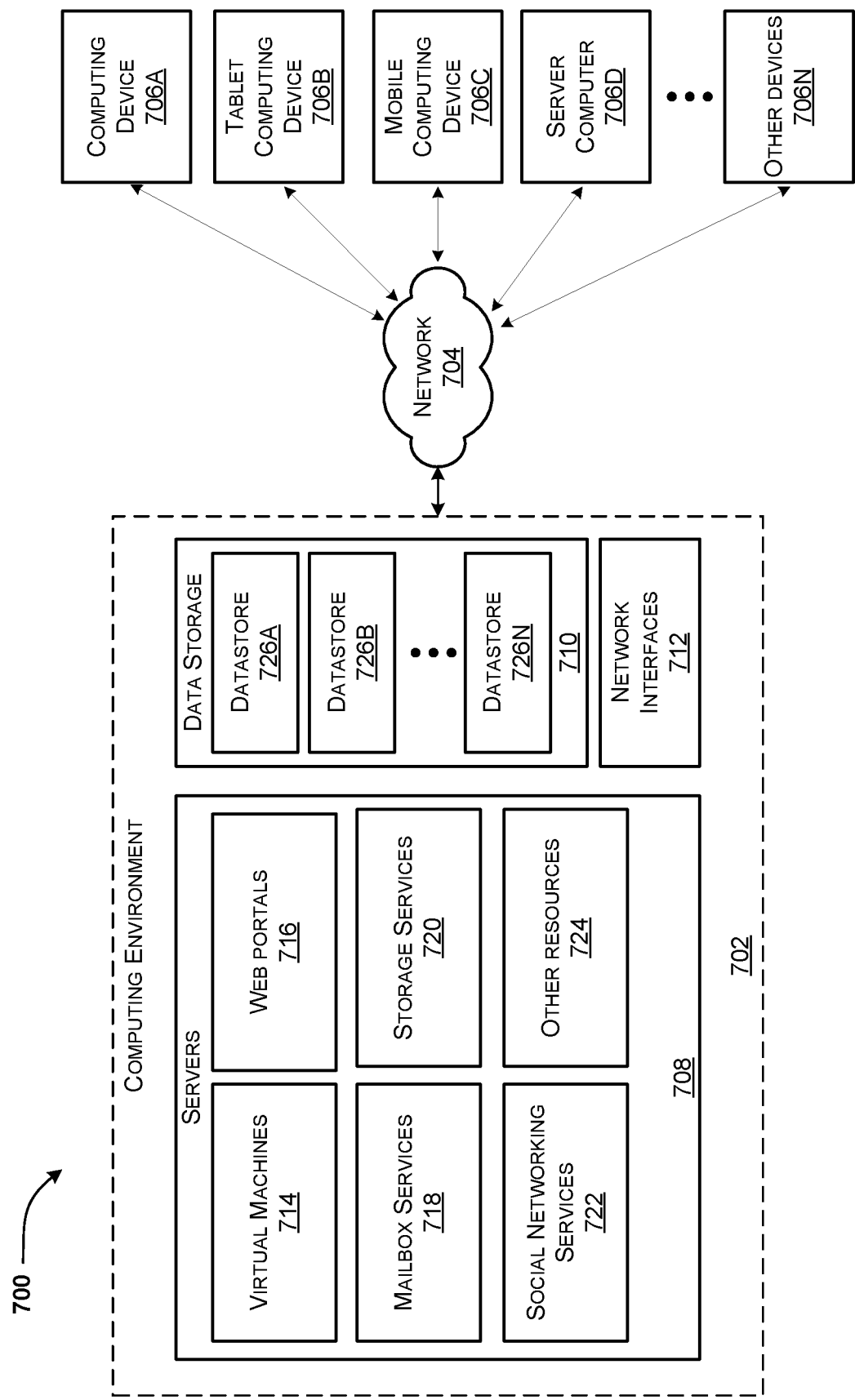
FIG. 7 is a diagram illustrating a distributed computing environment capable of implementing aspects of the techniques and technologies presented herein.

FIG. 7 depicts an illustrative distributed computing environment 700 capable of executing the software components described herein. Thus, the distributed computing environment 700 illustrated in FIG. 7 can be utilized to execute any aspects of the software components presented herein. For example, the distributed computing environment 700 can be utilized to execute aspects of the software components described herein.

Accordingly, the distributed computing environment 700 can include a computing environment 702 operating on, in communication with, or as part of the network 704. The network 704 can include various access networks. One or more client devices 706A-706N (hereinafter referred to collectively and/or generically as "computing devices 706") can communicate with the computing environment 702 via the network 704. In one illustrated configuration, the computing devices 706 include a computing device 706A such as a laptop computer, a desktop computer, or other computing device; a slate or tablet computing device ("tablet computing device") 706B; a mobile computing device 706C such as a mobile telephone, a smart phone, or other mobile computing device; a server computer 706D; and/or other devices 706N. It should be understood that any number of computing devices 706 can communicate with the computing environment 702.

In various examples, the computing environment 702 includes servers 708, data storage 610, and one or more network interfaces 712. The servers 708 can host various services, virtual machines, portals, and/or other resources. In the illustrated configuration, the servers 708 host virtual machines 714, Web portals 716, mailbox services 718, storage services 720, and/or social networking services 722. As shown in FIG. 7 the servers 708 also can host other services, applications, portals, and/or other resources ("other resources") 724.

As mentioned above, the computing environment 702 can include the data storage 710. According to various implementations, the functionality of the data storage 710 is provided by one or more databases operating on, or in communication with, the network 704. The functionality of the data storage 710 also can be provided by one or more servers configured to host data for the computing environment 700. The data storage 710 can include, host, or provide one or more real or virtual datastores 726A-726N (hereinafter referred to collectively and/or generically as "datastores 726"). The datastores 726 are configured to host data used or created by the servers 808 and/or other data. That is, the datastores 726 also can host or store web page documents, word documents, presentation documents, data structures, algorithms for execution by a recommendation engine, and/or other data utilized by any application program. Aspects of the datastores 726 may be associated with a service for storing files.

The computing environment 702 can communicate with, or be accessed by, the network interfaces 712. The network interfaces 712 can include various types of network hardware and software for supporting communications between two or more computing devices including the computing devices and the servers. It should be appreciated that the network interfaces 712 also may be utilized to connect to other types of networks and/or computer systems.

It should be understood that the distributed computing environment 700 described herein can provide any aspects of the software elements described herein with any number of virtual computing resources and/or other distributed computing functionality that can be configured to execute any aspects of the software components disclosed herein. According to various implementations of the concepts and technologies disclosed herein, the distributed computing environment 700 provides the software functionality described herein as a service to the computing devices. It should be understood that the computing devices can include real or virtual machines including server computers, web servers, personal computers, mobile computing devices, smart phones, and/or other devices. As such, various configurations of the concepts and technologies disclosed herein enable any device configured to access the distributed computing environment 700 to utilize the functionality described herein for providing the techniques disclosed herein, among other aspects.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

The disclosure presented herein also encompasses the subject matter set forth in the following clauses.

Example Clause A, a method for evaluating a resource requirement recommendation, the method comprising: receiving the resource requirement recommendation from a predictive model; retrieving, by a processing system, a system characteristic associated with currently available computing resources; generating an activity dataset by sampling an active software deployment at the currently available computing resources for a predetermined timeframe; generating a simulated computing environment based on the system characteristic and the activity dataset; assigning an instance of a pending software deployment to the simulated computing environment according to the resource requirement recommendation; and determining a level of resource utilization of the resource requirement recommendation by analyzing the instance of the pending software deployment within the simulated computing environment.

Example Clause B, the method of Example Clause A, wherein the instance of the pending software deployment is assigned to the simulated computing environment by a simulated scheduler that is configured using the activity dataset.

Example Clause C, the method of Example Clause A or Example Clause B, further comprising: generating, based on the activity dataset, a plurality of test scenarios, wherein each of the plurality of test scenarios modifies the activity dataset; configuring the simulated computing environment with the plurality of test scenarios; and executing the instance of the pending software deployment within the simulated computing environment according to each of the plurality of test scenarios.

Example Clause D, the method of any one of Example Clauses A through C, further comprising: determining that the level of resource utilization is below a threshold level of resource utilization; and in response to determining that the level of resource utilization is below the threshold level of resource utilization, assigning an additional instance of the pending software deployment to the simulated computing environment.

Example Clause E, the method of any one of Example Clauses A through C, wherein a plurality of resource requirement recommendations comprising the resource requirement recommendation is evaluated simultaneously, the method further comprising: determining that a particular resource requirement recommendation of the plurality of resource requirement recommendations is above a resource overutilization threshold; and in response to determining that the particular resource requirement recommendation of the plurality of resource requirement recommendations is above the resource overutilization threshold, removing the particular resource requirement recommendation from consideration for a selection.

Example Clause F, the method of Example Clause E, wherein each resource requirement recommendation of the plurality of resource requirement recommendations comprises a different number of instances of the pending software deployment.

Example Clause G, the method of any one of Example Clauses A through F, wherein the system characteristic comprises at least one of a number of available computing cores, an amount of available memory, or a volume of available storage.

Example Clause H, the method of any one of Example Clauses A through G, wherein the activity dataset comprises at least one of a distribution of the active software deployment, a resource utilization level of the active software deployment, or a resource allocation of the active software deployment.

Example Clause I, the method of any one of Example Clauses A through H, wherein the instance of the pending software deployment includes at least one of an allocated number of computing cores, an amount of allocated memory, or a volume of allocated storage.

Example Clause J, a system comprising: a processing system; and a computer-readable medium having encoded thereon computer-readable instructions that, when executed by the processing system, cause the system to: generate an activity dataset by sampling an active software deployment at the currently available computing resources for a predetermined timeframe; generate a simulated computing environment based on the activity dataset and a system characteristic associated with currently available computing resources; assign an instance of a pending software deployment to the simulated computing environment according to a resource requirement recommendation from a predictive model; and determine a level of resource utilization of the resource requirement recommendation by analyzing the instance of the pending software deployment within the simulated computing environment.

Example Clause K, the system of Example Clause J, wherein the instance of the pending software deployment is assigned to the simulated computing environment by a simulated scheduler that is configured using the activity dataset.

Example Clause L, the system of Example Clause J or Example Clause K, wherein the computer-readable instructions further cause the system to: generate, based on the activity dataset, a plurality of test scenarios, wherein each of the plurality of test scenarios modifies the activity dataset; configure the simulated computing environment with the plurality of test scenarios; and execute the instance of the pending software deployment within the simulated computing environment according to each of the plurality of test scenarios.

Example Clause M, the system of any one of Example Clauses J through L, wherein the computer-readable instructions further cause the system to: determine that the level of resource utilization is below a threshold level of resource utilization; and in response to determining that the level of resource utilization is below the threshold level of resource utilization, assign an additional instance of the pending software deployment to the simulated computing environment.

Example Clause N, the system of any one of Example Clauses J through L, wherein a plurality of resource requirement recommendations comprising the resource requirement recommendation is evaluated simultaneously, and wherein the computer-readable instructions further cause the system to: determine that a particular resource requirement recommendation of the plurality of resource requirement recommendations is above a resource overutilization threshold; and in response to determining that the particular resource requirement recommendation of the plurality of resource requirement recommendations is above the resource overutilization threshold, remove the particular resource requirement recommendation from consideration for a selection.

Example Clause O, the system of Example Clause N, wherein each resource requirement recommendation of the plurality of resource requirement recommendations comprises a different number of instances of the pending software deployment.

Example Clause P, the system of any one of Example Clauses J through O, wherein the system characteristic comprises at least one of a number of available computing cores, an amount of available memory, or a volume of available storage.

Example Clause Q, the system of any one of Example Clauses J through P, wherein the activity dataset comprises at least one of a distribution of the active software deployment, a resource utilization level of the active software deployment, or a resource allocation of the active software deployment.

Example Clause R, the system of any one of Example Clauses J through Q, wherein the instance of the pending software deployment includes at least one of an allocated number of computing cores, an amount of allocated memory, or a volume of allocated storage.

Example Clause S, a computer-readable storage medium having encoded thereon computer-readable instructions that when executed by a processing system cause a system to: receive a resource requirement recommendation from a predictive model; retrieve a system characteristic associated with currently available computing resources; generate an activity dataset by sampling an active software deployment at the currently available computing resources for a predetermined timeframe; generate a simulated computing environment based on the system characteristic and the activity dataset; assign an instance of a pending software deployment to the simulated computing environment according to the resource requirement recommendation; and analyze the instance of the pending software deployment within the simulated computing environment according to a plurality of test scenarios to determine a level of resource utilization of the resource requirement recommendation for each test scenario of the plurality of test scenarios.

Example Clause T, the computer-readable storage medium of Example Clause S, wherein the instance of the pending software deployment is assigned to the simulated computing environment by a simulated scheduler that is configured using the activity dataset.

It should be appreciated that any reference to "first," "second," etc. elements within the Summary and/or Detailed Description is not intended to and should not be construed to necessarily correspond to any reference of "first," "second," etc. elements of the claims. Rather, any use of "first" and "second" within the Summary, Detailed Description, and/or claims may be used to distinguish between two different instances of the same element (e.g., two different resource requirement recommendations).

In closing, although the various configurations have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A method for evaluating a resource requirement recommendation, the method comprising:
   receiving the resource requirement recommendation from a predictive model;
   retrieving a system characteristic associated with currently available computing resources;
   generating an activity dataset by sampling an active software deployment at the currently available computing resources for a predetermined timeframe;
   generating a simulated computing environment based on the system characteristic and the activity dataset;
   assigning an instance of a pending software deployment to the simulated computing environment according to the resource requirement recommendation; and
   determining a level of resource utilization of the resource requirement recommendation by analyzing the instance of the pending software deployment within the simulated computing environment.

2. The method of claim 1, wherein the instance of the pending software deployment is assigned to the simulated computing environment by a simulated scheduler that is configured using the activity dataset.

3. The method of claim 1, further comprising:
   generating, based on the activity dataset, a plurality of test scenarios, wherein each of the plurality of test scenarios modifies the activity dataset;
   configuring the simulated computing environment with the plurality of test scenarios; and
   executing the instance of the pending software deployment within the simulated computing environment according to each of the plurality of test scenarios.

4. The method of claim 1, further comprising:
   determining that the level of resource utilization is below a threshold level of resource utilization; and
   in response to determining that the level of resource utilization is below the threshold level of resource utilization, assigning an additional instance of the pending software deployment to the simulated computing environment.

5. The method of claim 1, wherein a plurality of resource requirement recommendations comprising the resource requirement recommendation is evaluated simultaneously, the method further comprising:
   determining that a particular resource requirement recommendation of the plurality of resource requirement recommendations is above a resource overutilization threshold; and
   in response to determining that the particular resource requirement recommendation of the plurality of resource requirement recommendations is above the resource overutilization threshold, removing the particular resource requirement recommendation from consideration for a selection.

6. The method of claim 5, wherein each resource requirement recommendation of the plurality of resource requirement recommendations comprises a different number of instances of the pending software deployment.

7. The method of claim 1, wherein the system characteristic comprises at least one of a number of available computing cores, an amount of available memory, or a volume of available storage.

8. The method of claim 1, wherein the activity dataset comprises at least one of a distribution of the active software deployment, a resource utilization level of the active software deployment, or a resource allocation of the active software deployment.

9. The method of claim 1, wherein the instance of the pending software deployment includes at least one of an allocated number of computing cores, an amount of allocated memory, or a volume of allocated storage.

10. A system comprising:
    a processing system comprising a processing unit; and
    a computer-readable medium having encoded thereon computer-readable instructions that, when executed by the processing system, cause the system to:
      generate an activity dataset by sampling an active software deployment at the currently available computing resources for a predetermined timeframe;
      generate a simulated computing environment based on the activity dataset and a system characteristic associated with currently available computing resources;
      assign an instance of a pending software deployment to the simulated computing environment according to a resource requirement recommendation from a predictive model; and
      determine a level of resource utilization of the resource requirement recommendation by analyzing the instance of the pending software deployment within the simulated computing environment.

11. The system of claim 10, wherein the instance of the pending software deployment is assigned to the simulated computing environment by a simulated scheduler that is configured using the activity dataset.

12. The system of claim 10, wherein the computer-readable instructions further cause the system to:
generate, based on the activity dataset, a plurality of test scenarios, wherein each of the plurality of test scenarios modifies the activity dataset;
configure the simulated computing environment with the plurality of test scenarios; and
execute the instance of the pending software deployment within the simulated computing environment according to each of the plurality of test scenarios.

13. The system of claim 10, wherein the computer-readable instructions further cause the system to:
determine that the level of resource utilization is below a threshold level of resource utilization; and
in response to determining that the level of resource utilization is below the threshold level of resource utilization, assign an additional instance of the pending software deployment to the simulated computing environment.

14. The system of claim 10, wherein a plurality of resource requirement recommendations comprising the resource requirement recommendation is evaluated simultaneously, and wherein the computer-readable instructions further cause the system to:
determine that a particular resource requirement recommendation of the plurality of resource requirement recommendations is above a resource overutilization threshold; and
in response to determining that the particular resource requirement recommendation of the plurality of resource requirement recommendations is above the resource overutilization threshold, remove the particular resource requirement recommendation from consideration for a selection.

15. The system of claim 14, wherein each resource requirement recommendation of the plurality of resource requirement recommendations comprises a different number of instances of the pending software deployment.

16. The system of claim 10, wherein the system characteristic comprises at least one of a number of available computing cores, an amount of available memory, or a volume of available storage.

17. The system of claim 10, wherein the activity dataset comprises at least one of a distribution of the active software deployment, a resource utilization level of the active software deployment, or a resource allocation of the active software deployment.

18. The system of claim 10, wherein the instance of the pending software deployment includes at least one of an allocated number of computing cores, an amount of allocated memory, or a volume of allocated storage.

19. A computer-readable storage medium having encoded thereon computer-readable instructions that when executed by a processing system cause a system to:
receive a resource requirement recommendation from a predictive model;
retrieve a system characteristic associated with currently available computing resources;
generate an activity dataset by sampling an active software deployment at the currently available computing resources for a predetermined timeframe;
generate a simulated computing environment based on the system characteristic and the activity dataset;
assign an instance of a pending software deployment to the simulated computing environment according to the resource requirement recommendation; and
analyze the instance of the pending software deployment within the simulated computing environment according to a plurality of test scenarios to determine a level of resource utilization of the resource requirement recommendation for each test scenario of the plurality of test scenarios.

20. The computer-readable storage medium of claim 19, wherein the instance of the pending software deployment is assigned to the simulated computing environment by a simulated scheduler that is configured using the activity dataset.

* * * * *